(12) United States Patent
Sommer

(10) Patent No.: US 7,376,018 B2
(45) Date of Patent: May 20, 2008

(54) NON-VOLATILE MEMORY DEVICE WITH SINGLE TRANSISTOR MEMORY CELL

(75) Inventor: Michael Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 11/416,085

(22) Filed: May 1, 2006

(65) Prior Publication Data

US 2007/0253247 A1 Nov. 1, 2007

(51) Int. Cl.
*G11C 11/34* (2006.01)
(52) U.S. Cl. .................. 365/185.26; 365/148; 365/149
(58) Field of Classification Search ........... 365/185.26, 365/148, 149
See application file for complete search history.

(56) References Cited

U.S. PATENT DOCUMENTS

| | | | |
|---|---|---|---|
| 6,628,152 B1 | 9/2003 | Kern et al. | 327/143 |
| 6,842,372 B1 | 1/2005 | Hu | 365/185.05 |
| 6,979,853 B2 | 12/2005 | Sommer et al. | 257/302 |
| 2002/0012271 A1* | 1/2002 | Forbes | 365/185.14 |
| 2002/0113262 A1* | 8/2002 | Forbes | 257/315 |
| 2002/0181283 A1* | 12/2002 | Ghodsi | 365/185.18 |
| 2005/0180211 A1* | 8/2005 | Guterman et al. | 365/185.03 |

* cited by examiner

*Primary Examiner*—Tuan T. Nguyen
(74) *Attorney, Agent, or Firm*—Davidson, Davidson & Kappel, LLC

(57) ABSTRACT

A non-volatile memory device includes a plurality of word lines, a plurality of sense lines, and a plurality of non-volatile memory cells. Each memory cell includes a floating gate transistor having a control gate, a floating gate separated dielectrically from the control gate, a drain connection and a source connection. The control gate is connected to one of the word lines and the source connection is connected to one of the sense lines, the drain connection being electrically isolated from the other memory cells. A method for reading the memory device and a method for operating the memory device are also provided.

14 Claims, 6 Drawing Sheets

NON-VOLATILE MEMORY DEVICE WITH SINGLE TRANSISTOR MEMORY CELL

BACKGROUND OF THE INVENTION

The present invention relates to non-volatile memory devices such as electrically erasable programmable read-only memory devices (EEPROMS).

U.S. Pat. No. 6,842,372 is entitled "EEPROM cell having a floating gate transistor within a cell well and a process for fabricating the memory cell" and is hereby incorporated by reference herein.

U.S. Pat. No. 6,979,853 discloses a DRAM and is hereby incorporated by reference herein.

BRIEF SUMMARY OF THE INVENTION

The present invention provides a non-volatile memory device comprising a plurality of word lines, a plurality of sense lines, and a plurality of non-volatile memory cells. Each memory cell includes a floating gate transistor having a control gate, a floating gate separated dielectrically from the control gate, a drain connection and a source connection. The control gate is connected to one of the word lines and the source connection is connected to one of the sense lines, the drain connection being electrically isolated from the other memory cells.

The present invention also provides a method for reading out a non-volatile memory having a plurality of non-volatile memory cells each having a floating gate transistor having a control gate, a floating gate, a source connection and a drain connection, the control gate connected to a word line and the source connection to a sense line, the floating gate transistor being preprogrammed into either a first logical value where the floating gate has a first low voltage or a second logical value where the floating gate has a second high voltage. The method includes the steps of:

providing a control voltage to the word line;

measuring a sense voltage at the sense line; and determining if the transistor has the first logical value or second logical value as a function of a capacitance of the sense line.

The present invention also provides a method for operating a memory device having a plurality of floating gate transistors as both a non-volatile memory and a DRAM. The method includes the steps of:

in a non-volatile memory mode, preprogramming the plurality of floating gate transistors by setting the floating gate to a first voltage corresponding to a first logical value or a second voltage lower than the first voltage corresponding to a second logical value;

reading out the first or second logical values of the floating gate transistors during the non-volatile memory mode; and in a DRAM mode, setting the floating gate transistors to one of the first or second logical modes; and setting and reading the transistors dynamically during the DRAM mode.

BRIEF DESCRIPTION OF THE SEVERAL VIEWS OF THE DRAWING(S)

The present invention will be further described with reference to preferred embodiments, in which.

DETAILED DESCRIPTION OF THE INVENTION

Figure 1:
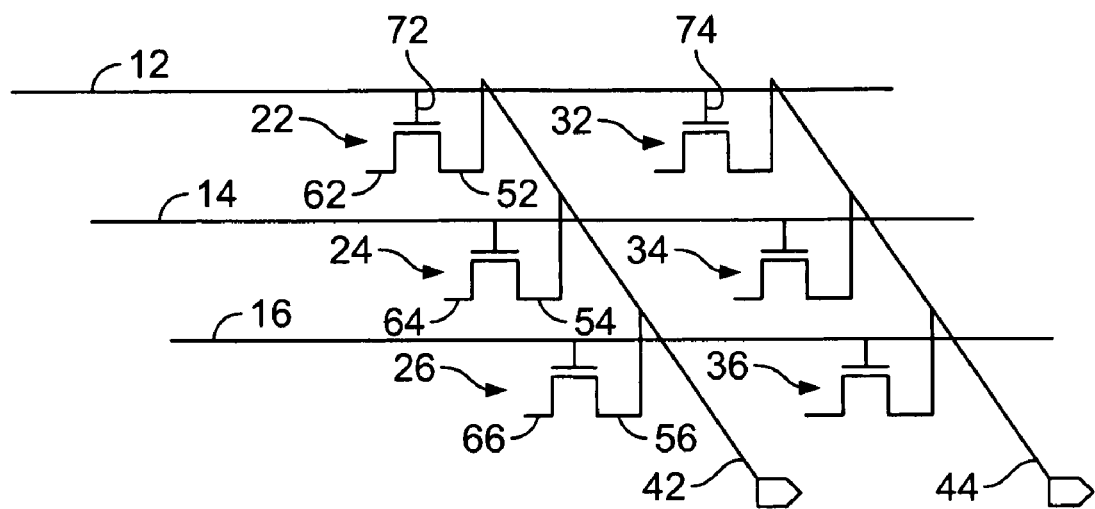
FIG. 1 shows schematically one embodiment of the memory device of the present invention.

FIG. 1 shows schematically one EEPROM embodiment according to the present invention, in which a plurality of word lines 12, 14, 16 and a plurality of floating gate transistors 22, 24, 26, 32, 34, 36. The control gates 72, 74 of transistors 22, 32 are connected to word line 12, the control gates of transistors 24, 34 to word line 14, and the control gates of transistors 26, 36 to word line 16. Each source connection or node 52, 54, 56 of the transistors 22, 24, 26 is connected to a bit or sense line 42, while each source connection of the transistors 32, 34, 36 is connected to a sense line 44.

Each drain connection 62, 64, 66 of the transistors however remains open and thus is electrically isolated from the other transistors.

More word and sense lines than those shown typically would be provided for a typical memory array.

The memory cell for the EEPROM thus has a floating gate transistor where only a single bit line or sense line is used for reading out. As opposed to EEPROM previous memory cells where a current difference through the cell was detected by the sense amplifier and converted into a voltage indicating a logical 1 or 0 and where where each memory cell was connected to a drain contact, the present invention advantageously does not require a drain contact. Valuable silicon surface area can be saved, since the memory cell value need no longer determined by a current flowing through it. The sense line 42 can be used to determine if the voltage at the floating gate is high or low, and thus whether the cell is a logical zero or a logical one as well be discussed below.

Figure 2:
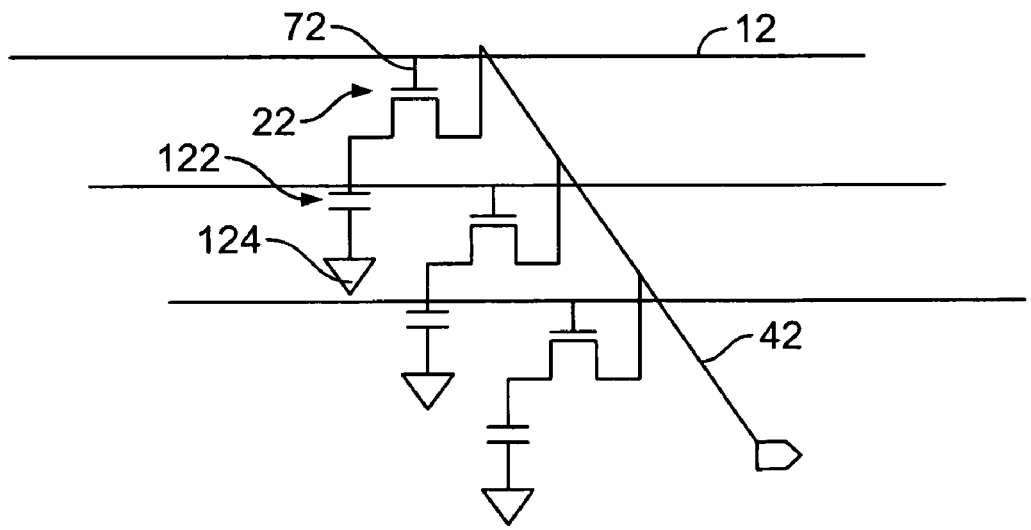
FIG. 2 shows schematically a second embodiment of the memory device of the present invention.

FIG. 2 shows schematically a second embodiment of the memory device of the present invention in which each memory cell has a floating gate transistor 22 and a capacitor 122 attached to ground 124. Thus when the voltage at gate 72 exceeds the low voltage at the floating gate of transistor 22, not only is the channel capacitance added to the sense line 42, but the extra capacitance of capacitor 122 is added as well. This embodiment can improve sensing of the memory cell status.

This present embodiment also permits the memory device to operate in both an EEPROM mode and a DRAM mode. For DRAM operation, if all the memory cell floating gates are set to a single low voltage, the equivalent of an "erase" or "write all" operation for the EEPROM, a DRAM structure is created due to the capacitance provided when the gate voltage exceeds the low voltage. For example, if one wishes to use this type of memory in a laptop, the DRAM mode is preferred in normal operation and the non volatile memory (NVM) mode in the powered-down or even in the switched-off state. When the computer is turned on, operation may resume immediately at the point where the user stopped. The long wait time of startup may thus be considerably shortened.

Figure 3:
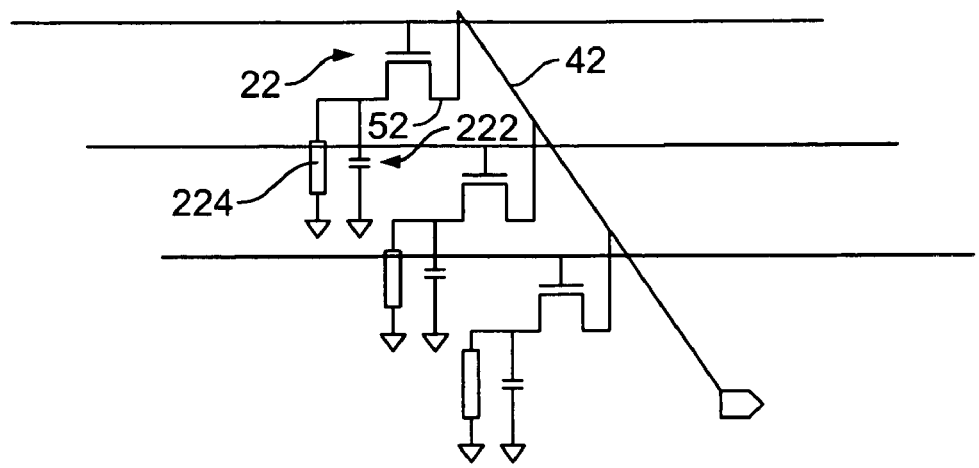
FIG. 3 shows schematically a third embodiment of the memory device of the present invention.

FIG. 3 shows schematically a third embodiment of the memory device of the present invention, where each memory cell includes not only the transistor 22 but also a capacitor 222 connected in parallel to ground with a resistor 224.

The resistor 224 can be highly resistive with respect to the channel resistance, and thus can aid in programming the cell 22. For example, if during programming, a voltage is applied at source 52 via sense line 42 to charge the floating gate, the resistance 224 can aid in maintaining the charging voltage.

Figure 4:
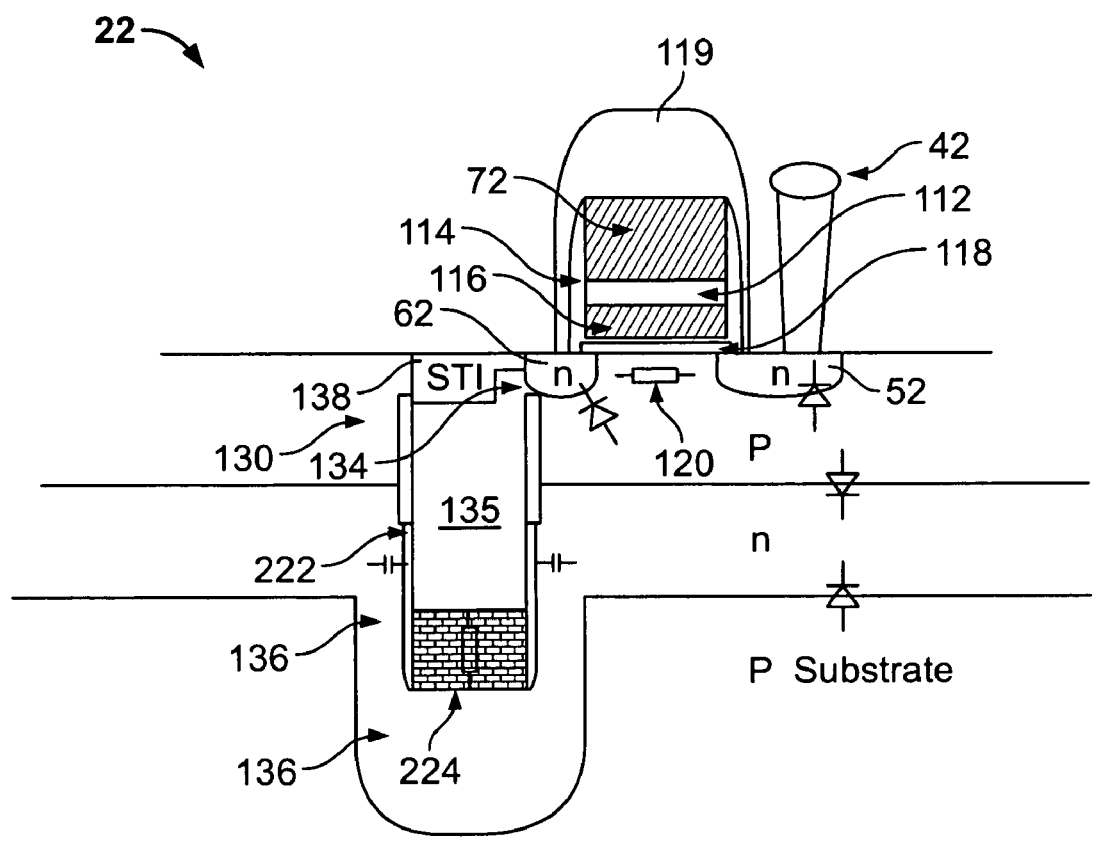
FIG. 4 shows a possible wafer layout for one of the memory cells of the FIG. 3 embodiment.

FIG. 4 shows a possible wafer layout for one of the memory cells of the FIG. 3 embodiment. Transistor 22 has a source connection 52 connected to a sense line 42, and a drain connection 62. Source connection 42 and drain connection 62 may be a conductive n– material, and separated by a p material channel 120 which has a variable channel resistance depending on the voltage at the transistor gate. The gate includes a control gate 72 and a floating gate 116 separated by a dielectric layer, for example an oxide nitride oxide. A tunnel oxide 118 can sit below the floating gate 116 on top of the p layer, and connect source connection 52 and drain connection 62. A side wall oxide 114 can fully isolate floating gate 116 and nitride cap 119 can cap the gate structure.

Electrically connected to drain electrode 62 via a buried strap out diffusion 134 is a polysilicon conductive area 135. Area 135 is capped with a shallow trench isolation structure 138. A thick oxide collar 130 separates the p layer from the area 135, and a capacitor 222 for example a thin oxide dielectric, surrounds the lower part of area 135 and connects to the buried n-well, which functions as ground. An arsenic out-diffusion 136 in a p substrate, can be formed with the buried n-well and provide ground for a resistor 224 connected to the area 135. Resistor 224 may be for example a low-dopes polysilicon material with bottom contact to the out diffusion 136 and may be surrounded by the thin oxide dielectric of capacitor 222.

Figure 5:
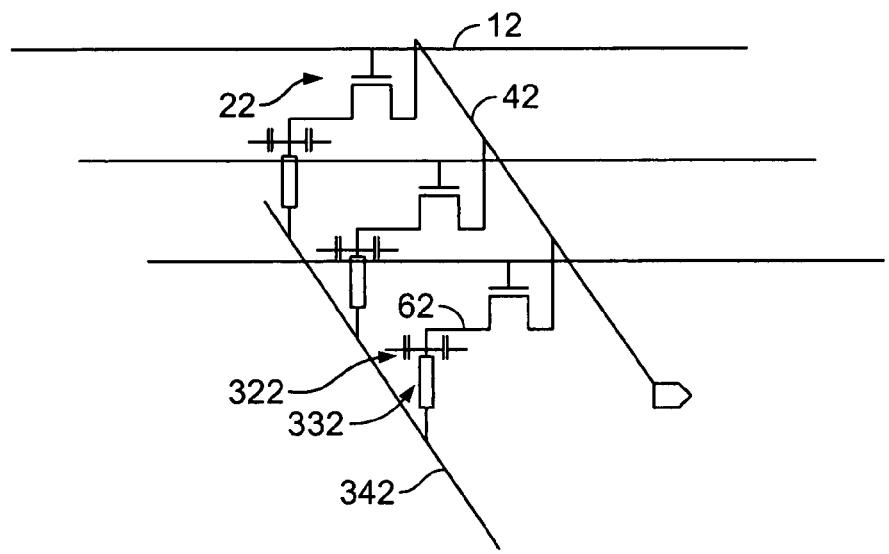
FIG. 5 shows schematically a fourth embodiment of the memory device of the present invention.
Figure 6:
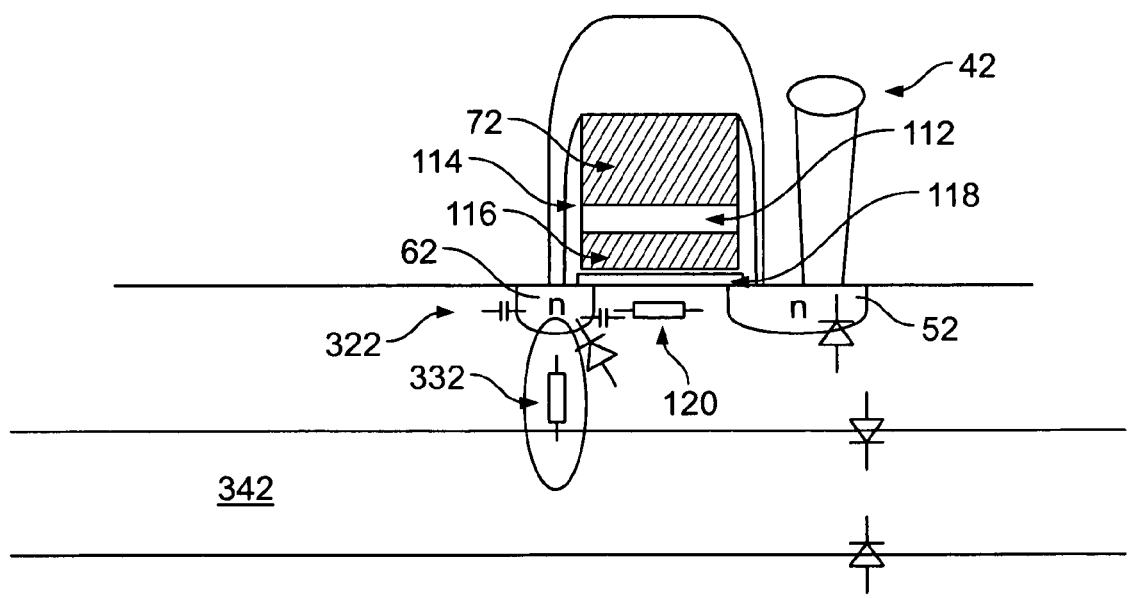
FIG. 6 shows a possible wafer layout for one of the memory cells of the FIG. 5 embodiment.

FIG. 5 shows schematically a fourth embodiment of the memory device of the present invention, with a capacitor 322 and resistor 332 connected to drain 62 of the transistor of the memory cell. A ground 342 can be provided by buried n well, as shown in FIG. 6 which shows a possible wafer layout for one of the memory cells of the FIG. 5 embodiment. In this case, the resistor 332 can be a resistor also highly resistive compared to the channel resistance 120, and can be for example made of highly doped n-, p-type materials as well as nitride. The capacitor 322 may be for example a large junction capacitor at the pn junction of drain 62.

Figure 7:
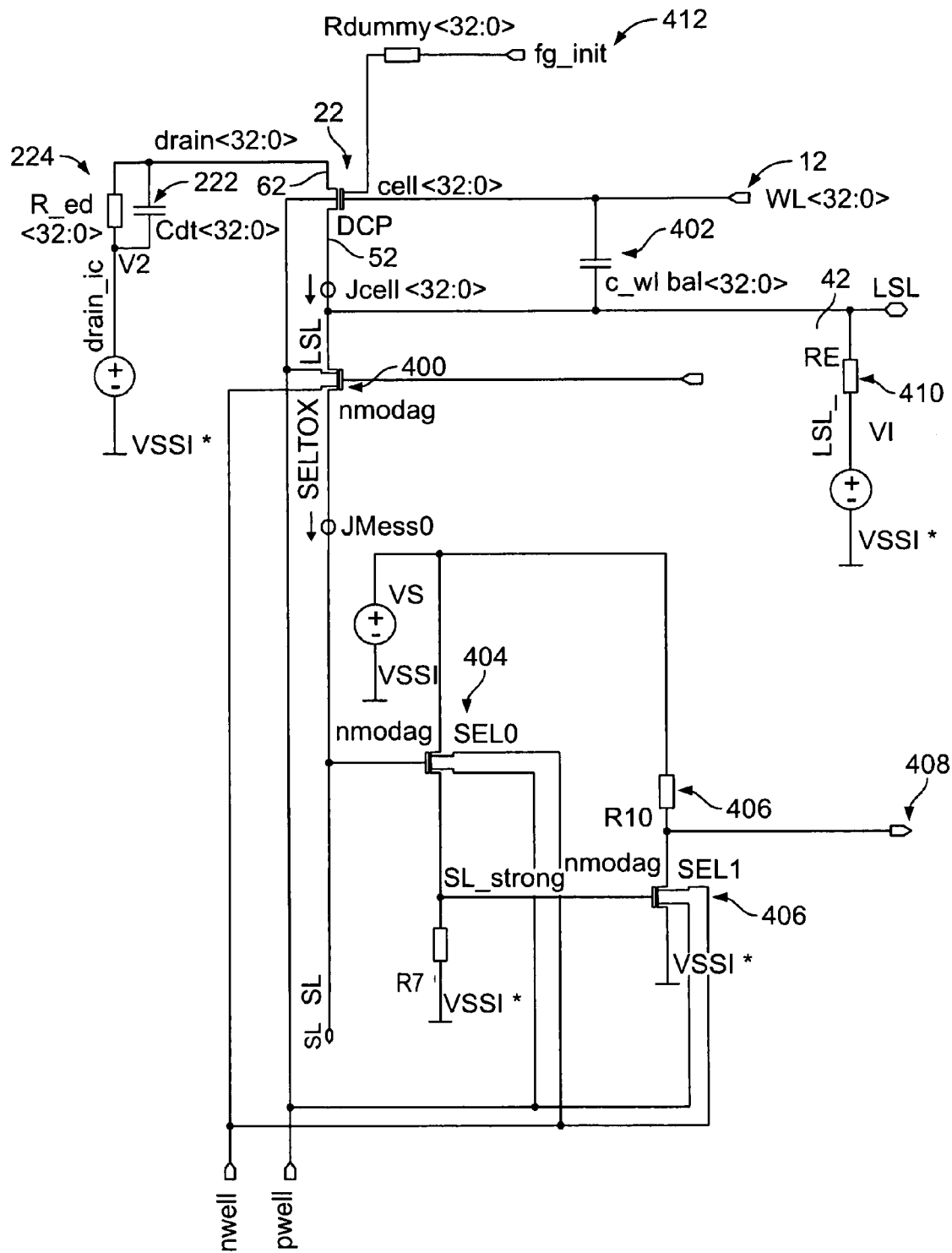
FIG. 7 shows schematically possible electrical connections for the third embodiment shown in FIG. 3, together with a possible sense amplifier.

FIG. 7 shows schematically possible electrical connections for the third embodiment shown in FIG. 3, together with a possible sense amplifier. Local sense line 42 is resistively coupled to ground as shown schematically by resistor 410. Word line 12 is also capacitively connected to sense line 42, as shown schematically at capacitor 402. A floating node potential 412 is shown schematically connected to the floating gate and defines the threshold voltage.

The sense amplifier section can include a transmission transistor 400 have the same p-well as the transistor 22, and having an output. The transistor can be turned on or off via its gate, and when on, the sense line 42 passes to a simple source follower 404 functioning as the input stage of the sense amplifier. The amplifier section 406 includes a resistor and transistor as shown, and the filtered output 408 is located between them.

Figure 8:
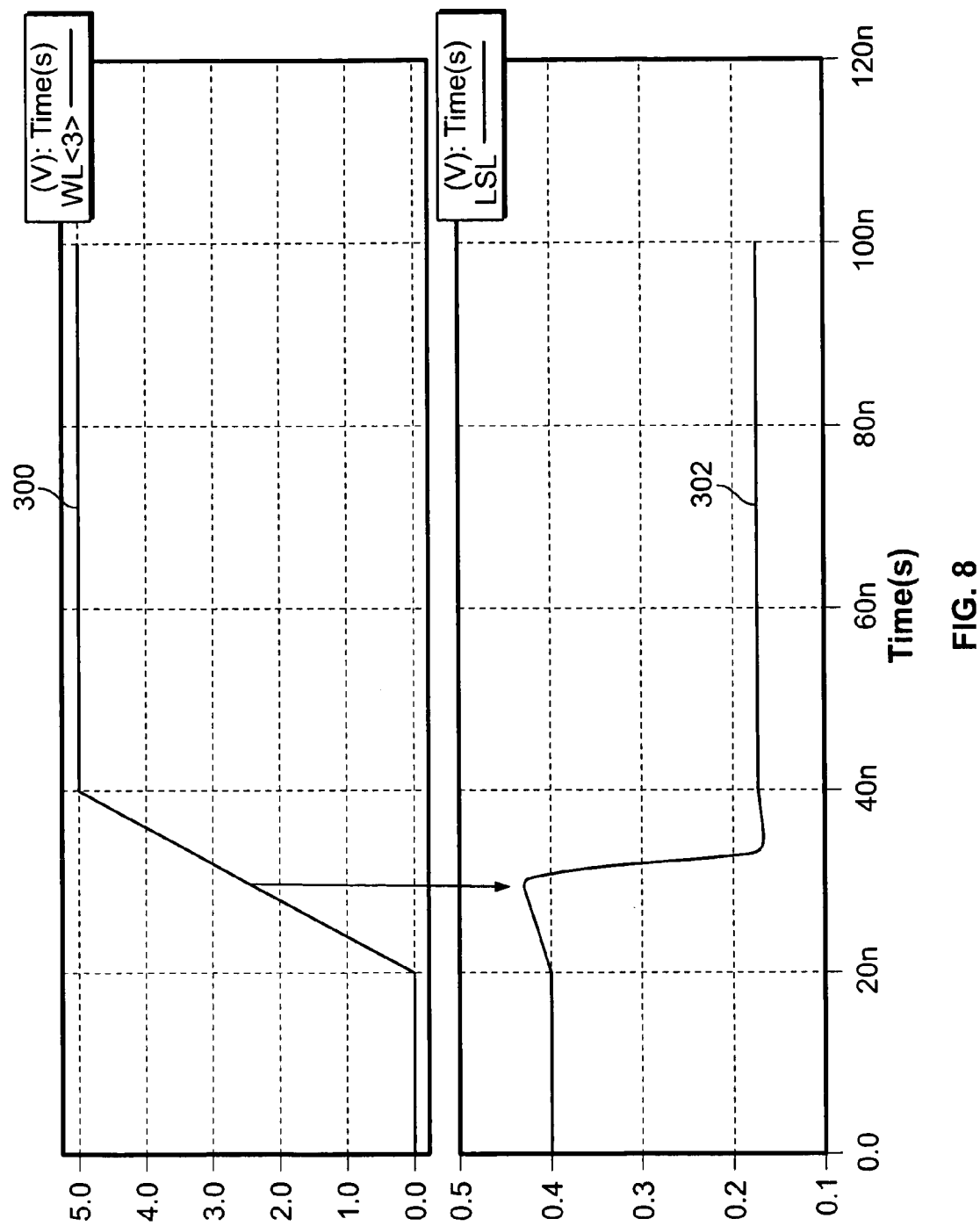
FIG. 8 shows a predicted effect of the capacitive coupling of a closed transistor which is opened when a word line is charged.

FIG. 8 shows a predicted effect of the capacitive coupling of a closed transistor 22 in FIG. 7 at the local sense line 42 when the transistor is opened when word line 12 is charged. A word line may begin charging at a time of twenty nanoseconds and increased to 5 volts at 40 nanoseconds as shown by line 300. When the word line 12 voltage exceeds a low voltage of the floating gate of one of the transistors 22, 32, the voltage in the local sense line 42 drops due to the increased capacitance on sense line 42 and the fact that the capacitance is pre-charged to ground. The minor increase at the time of twenty nanoseconds of the sense line voltage in line 302 and the minor decrease after the drop is due to the capacitive coupling 402 of the word line 12 to the sense line 42 as shown in FIG. 7.

Figure 9:
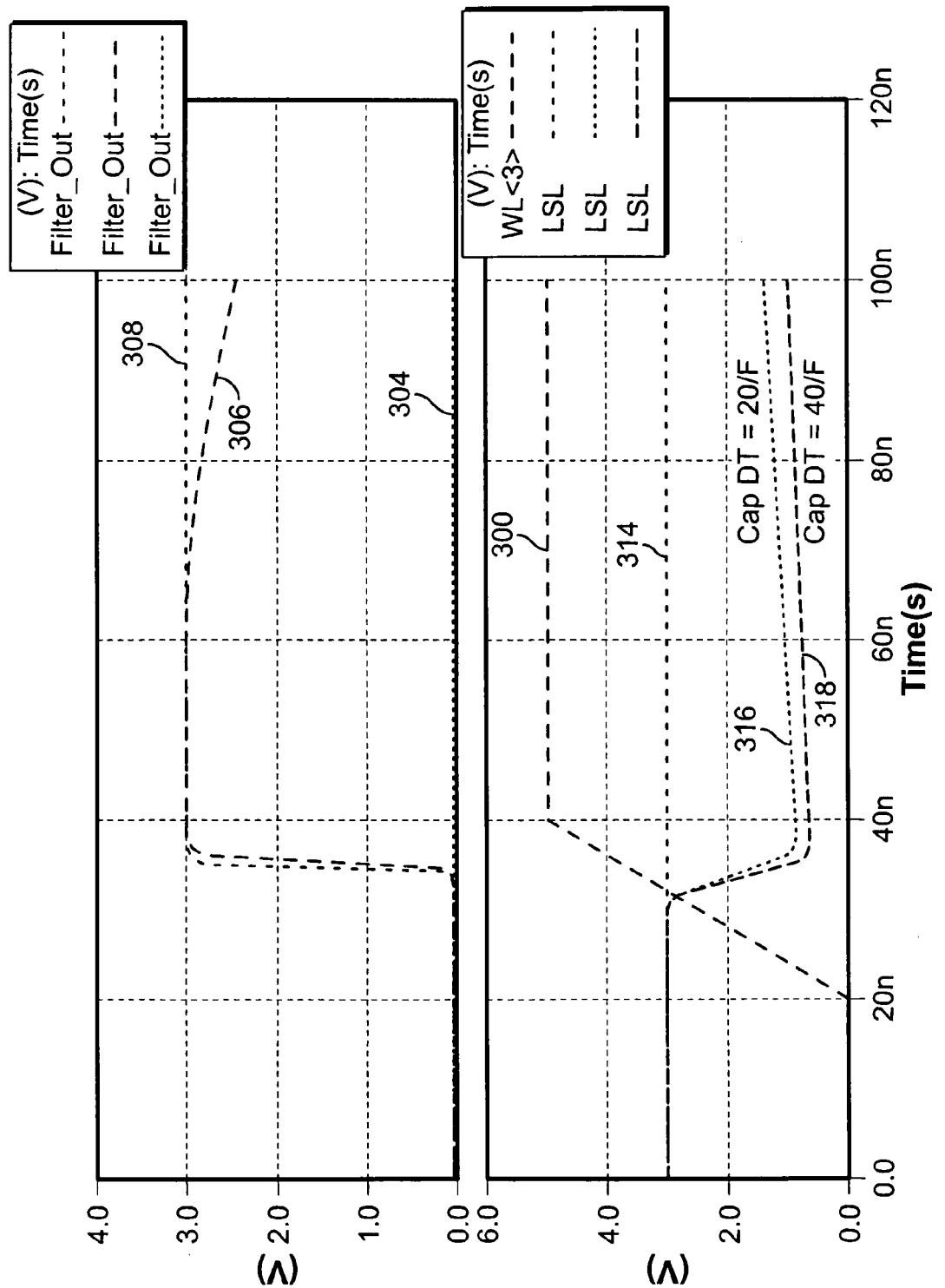
FIG. 9 shows a predicted sense line and filter output of the FIG. 7 embodiment for open and closed transistors.

FIG. 9 shows sense line and filter output of the FIG. 7 embodiment for open and closed transistors.

In the bottom section line 300 shows a possible input for the word line voltage as in FIG. 8. Line 314 shows the effect of line 300 on a transistor 22 of the memory cell set to have a high starting floating gate voltage. No effect on the local sense line 42 is seen as the gate voltage does not effect the transistor since it does not exceed the floating gate voltage. Lines 316 and 318 show the predicted effect on the sense line 42 at different capacitances at capacitor 222, with the voltage then rising slowly as the leakage of the sense line to ground degenerates the signal.

In the top section the filter output is shown, with line 308 showing a predicted filter output at 408, and 306 a predicted filter output as the leakage of the sense line to ground occurs. Line 304 shows the filter output not being affected when the transistor floating gate is charged to a high voltage, for example 12 volts.

Another embodiment in addition to the extra cell capacitance for transistor 22 shown in FIGS. 2, 3 and 5 is a high-resistance resistor instead of or in series with the additional cell capacitance. During the read operation, charge can not only be drained to the additional capacitor via the cell transistor, but also via the resistor. However, the resistor must be sufficiently large to allow sufficient channel voltage for programming or non-programming of the cell via sense line 42 and source gate 52. Also, in this variant, DRAM operation no longer possible, since no charge can be held in the additional capacitor as the resistor drains the charge.

Possible readout methods for the memory arrays created with the present invention include frequency analysis, capacitive voltage division, or determination of a capacitor charge.

Depending on the starting voltage of the cell, a capacitance, e.g., the channel capacitance, is or is not added once to the sense line 42. This depends on the programming of the cell, i.e., its starting voltage. The read operation of the sense line 42 may take place as early as at the time when the word line 12 is turned on. Capacitive coupling of the word line 12 with the sense line 42 causes a continuous rise in the sense line. At the instance when the cell transistor 22 sees a word line voltage and thus gate voltage greater than the starting voltage at the floating gate, the transistor 22 opens its channel, and charge is drained from the sense line 42.

This charge equalization causes a brief voltage change. The relatively short, pulse-type voltage drop from the charge equalization is superimposed on the relatively slow, capacitively coupled rise of the word line 12 via the transistor channel. This high-frequency component may be filtered and analyzed and read. The read operation corresponds to a frequency analysis. This novel readout concept also speeds up the read operation considerably.

Another possibility of measuring the capacitive change may be provided by one-time or two-time capacitance measurements. A one-time capacitance measurement is only possible when the distribution between with and without channel widening is largely constant with little scatter over the manufacturing process. The two-phase readout of the sense line 42 capacitance takes place shortly before the word line 12 voltage has reached the low starting voltage of the selection transistor 22 and shortly thereafter. If both measurements are identical, the starting voltage of the cell has become too high for a channel to have been able to widen. The channel capacitance was not connected to the sense line 42. If the two measurements are different, the selection transistor 22 has opened and the channel capacitance has been added, i.e., the overall capacitance has increased.

The invention claimed is:

1. A non-volatile memory device comprising:
   a plurality of word lines;
   a plurality of sense lines; and
   a plurality of non-volatile memory cells, each memory cell comprising a floating gate transistor having a control gate, a floating gate separated dielectrically from the control gate, a drain connection and a source connection, the control gate being connected to one of the word lines and the source connection being connected to one of the sense lines, the drain connection being electrically isolated from the other memory cells.

2. The non-volatile memory device as recited in claim 1 wherein the memory device is an EEPROM.

3. The non-volatile memory device as recited in claim 1 wherein each memory cell further includes a capacitor connected to the drain connection.

4. The non-volatile memory device as recited in claim 3 wherein each memory cell further includes a resistor connected to the drain connection.

5. The non-volatile memory device as recited in claim 1 wherein each memory cell further includes a resistor connected to the drain connection.

6. The non-volatile memory device as recited in claim 1 wherein the transistor is a p-channel transistor.

7. The non-volatile memory device as recited in claim 6 wherein the transistor includes a capacitor connected to an n-layer below a p-layer of the transistor.

8. The non-volatile memory device as recited in claim 6 wherein the transistor includes a junction capacitor connected to a p-layer of the transistor.

9. A method for reading out a non-volatile memory having a plurality of non-volatile memory cells each having a floating gate transistor having a control gate, a floating gate, a source connection and a drain connection, the control gate connected to a word line and the source connection to a sense line, the floating gate transistor being preprogrammed into either a first logical value where the floating gate has a first low voltage or a second logical value where the floating gate has a second high voltage, the method comprising the steps of:
   providing a control voltage to the word line;
   measuring a sense voltage at the sense line; and
   determining if the transistor has the first logical value or second logical value as a function of a capacitance of the sense line.

10. The method as recited in claim 9 wherein the transistor has a capacitor connected to the drain connection.

11. The method as recited in claim 9 wherein the determining step includes determining if the sense line experiences a voltage drop when the word line reaches the first low voltage.

12. The method as recited in claim 9 wherein the determining step includes measuring the capacitance in the sense line.

13. The method as recited in claim 12 wherein the measuring of the capacitance occurs before the word line voltage reaches the first low voltage and after the word line voltage reached the first low voltage, the capacitance at both times then being compared.

14. A method for operating a memory device having a plurality of floating gate transistors as both a non-volatile memory and a DRAM comprising the steps of:
   in a non-volatile memory mode, preprogramming the plurality of floating gate transistors by setting the floating gate to a first voltage corresponding to a first logical value or a second voltage lower than the first voltage corresponding to a second logical value;
   reading out the first or second logical values of the floating gate transistors during the non-volatile memory mode; and
   in a DRAM mode, setting the floating gate transistors to one of the first or second logical modes; and
   setting and reading the transistors dynamically during the DRAM mode.

* * * * *